United States Patent [19]

Gonzalez

(10) Patent No.: US 6,664,805 B2
(45) Date of Patent: Dec. 16, 2003

(54) SWITCHED CAPACITOR PIECEWISE LINEAR SLEW RATE CONTROL METHODS FOR OUTPUT DEVICES

(75) Inventor: Jason Gonzalez, Ft. Collins, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/060,535

(22) Filed: Jan. 30, 2002

(65) Prior Publication Data

US 2003/0141894 A1 Jul. 31, 2003

(51) Int. Cl.$^7$ .............................................. H03K 19/003
(52) U.S. Cl. .............................. 326/26; 326/27; 326/87
(58) Field of Search ......................... 326/26, 27, 30–34, 326/82, 83, 87, 90

(56) References Cited

U.S. PATENT DOCUMENTS

| 5,283,631 A | * | 2/1994 | Koerner et al. ............. 307/451 |
| 5,717,342 A | | 2/1998 | Lotfi et al. |
| 5,739,714 A | * | 4/1998 | Gabara ........................ 327/384 |
| 6,043,682 A | | 3/2000 | Dabral et al. |

* cited by examiner

Primary Examiner—Anh Tran

(57) ABSTRACT

A novel method and apparatus is presented for reducing the slew rate signals on transmission lines of integrated circuits by stepwise ramping up or down the voltage level on the transmission line. Switched capacitors or current sources are connected to either directly to the transmission line itself, or to the control input of a driver device characterized by a linear region during which the output voltage on the transmission line is proportional to the voltage seen at the control input.

20 Claims, 10 Drawing Sheets

SWITCHED CAPACITOR PIECEWISE LINEAR SLEW RATE CONTROL METHODS FOR OUTPUT DEVICES

FIELD OF THE INVENTION

The present invention relates generally to integrated circuits, and more particularly to a method for controlling the slew rate of output drivers using switched capacitors.

BACKGROUND OF THE INVENTION

As integrated circuit bus speeds continue to increase, system designers are faced with transmission line issues previously relegated to the analog world. At very high speeds, pc-board traces behave like transmission lines, and reflections occur at all points on the pc-board trace where impedance mismatches exist.

The transition between digital states does not occur instantaneously, but instead occurs over a period of time that is dependent on the physical conditions present on the transmission line. It is well known that signal transitions over a transmission line will suffer a delay known as a propagation delay due to the parasitic resistance, inductance, and capacitance of the line. This delay increases with the length of the line. In addition, it is also well-known that unless the impedance of the transmission line matches that of the load it drives, the signal will degrade due to reflections caused by impedance mismatching.

Signal reflections produce or contribute to a number of problems, including false triggering in clock lines, erroneous bits on data, address, and control lines, clock and signal jitter, and an increase in total emissions from the pc board. One method of reducing these transmission-line effects is to properly terminate the lines. This is especially true when the driver circuit drives multiple loads with differing impedances, the transmission line requires multiple stubs to properly match each of the loads during realtime operation. However, the use of multiple stubs then generates multiple reflections. One way of ensuring proper detection of signal states is to slow the slew rates of the signal's transitioning edges.

However, this competes with the trend towards ever increasing signal frequencies, which results in higher edge rates. Accordingly, a need exists for a technique for controlling the slew rate of signal edge transitions without sacrificing the signal frequency.

SUMMARY OF THE INVENTION

The present invention is a method and circuit for controlling the slew rate of integrated circuit output drivers without sacrificing switching frequency using digitally programmed switched capacitors. In particular, the control input of the output switching device that drives the transmission line to one state or another is charged/discharged to a predetermined first charge level associated with a first step in a sequence of a plurality of charging steps. If a next sequential step in a sequence of a plurality of charging steps exists, the control input of the output switching device is charged/discharged to a predetermined next charge level associated with the next step. The control input of the output switching device is repeated charged/discharged to successively higher/lower charge levels for each step in the sequence of charging steps. When the voltage level on either the control input of the output switching device or the transmission line reaches a predetermined reference voltage, the control input of the output switching device is connected to a maximum ON voltage source In accordance with a first embodiment of the method of the invention, when a transmission line is to be driven to a particular state by a driver device, within an amount of time much less than the setup time for turning on the driver device, the voltage on the predrive line that controls the driver device is quickly pulled to a level at or very near to the turn-on threshold voltage of the driver device. A sequence of programmed steps sequentially connects an increasing/decreasing capacitance to the predrive line to step up/down the voltage level on the predrive line, resulting in a desired controlled slope of the transmission line signal. Once the voltage level on the transmission line reaches a predetermined reference voltage level (e.g., the saturation voltage), the predrive line is quickly pulled to the "on" voltage level to finish out the transition.

In a second embodiment, the output buffer is configured with a respective pulldown and pullup predriver circuit, which respectively operate to sequentially connect various combinations of a plurality of switched capacitors to the transmission line according to a switched capacitance sequence comprising a plurality of capacitance steps. In the preferred embodiment, the capacitance steps preferably increase/decrease in capacitance for each step in the sequence. Thus, the voltage on transmission line increases/decreases with each step in the switched capacitance sequence. Preferably, a controller allows programmable selection of the combination of switched capacitors to supply a preferred combined parallel capacitance that results in a step-wise linear signal of a desired slope on transmission line.

BRIEF DESCRIPTION OF THE DRAWING

The invention will be better understood from a reading of the following detailed description taken in conjunction with the drawing in which like reference designators are used to designate like elements, and in which.

DETAILED DESCRIPTION

A novel method and circuit for controlling the slew rate of output drivers by stepping through a sequence of increasing/decreasing switched capacitors is described in detail hereinafter. Although the invention is described in terms of specific illustrative embodiments, such as specific output driver designs, it is to be understood that the embodiments described herein are by way of example only and the scope of the invention is not intended to be limited thereby.

Figure 1:
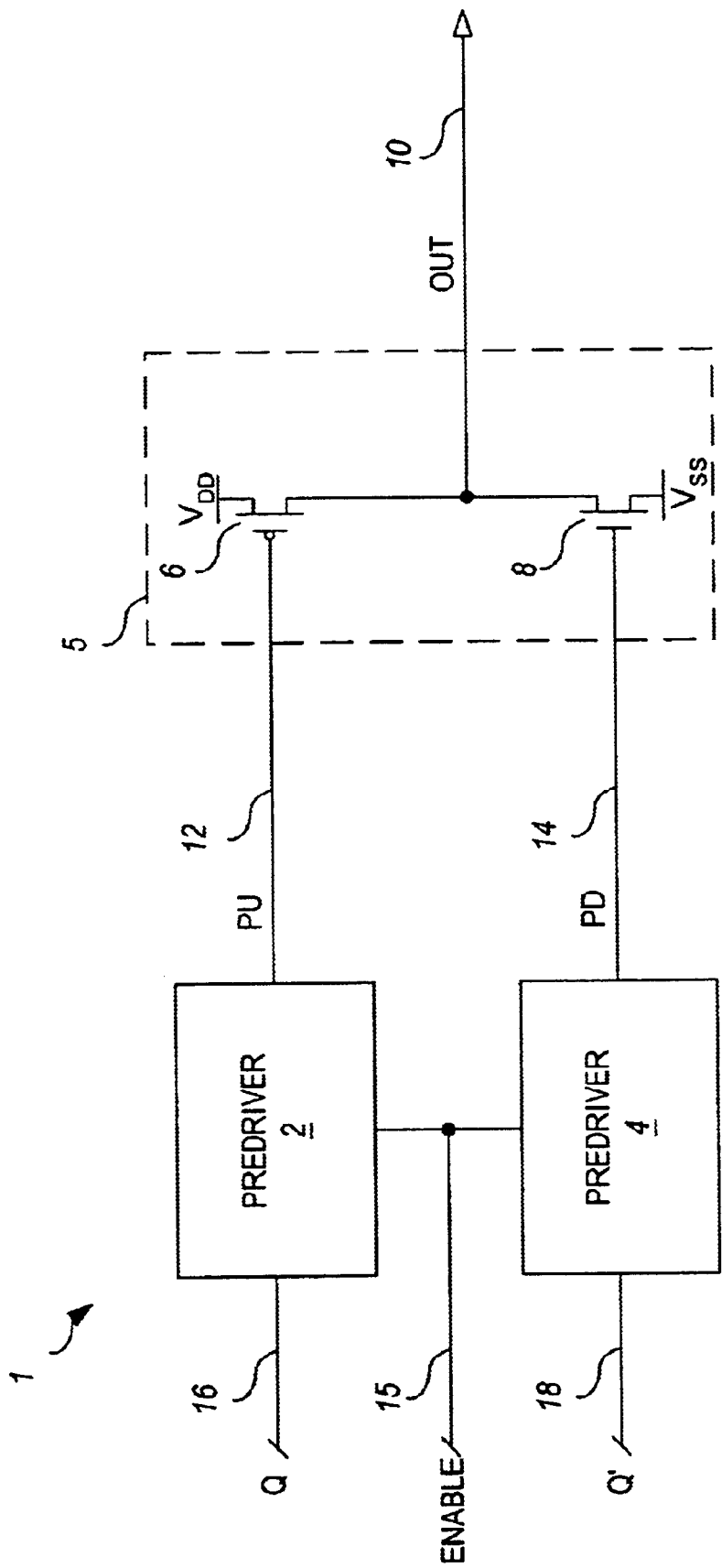
FIG. 1 is a schematic block diagram of a conventional output driver.

Turning now in detail to the drawing, FIG. 1 is a block diagram of a prior art output driver 1 configured to output a signal OUT on a transmission line 10. A driver circuit 5 is coupled to the transmission line 10. Driver circuit 5 comprises at least two switching devices 6, 8 that are used to connect the transmission line 10 to respective high and low voltage supplies $V_{DD}$ and $V_{SS}$. The switching devices 6, 8 generally have terminals that allow the position of the switches 6, 8 to change and are connected to respective predriver circuits 2, 4, via respective lines 12, 14. Typically, the switching devices 6, 8 are implemented using a p-channel field effect transistor (PFET) and n-channel field effect transistor (NFET) respectively.

The input lines 16 and 18 of the predriver circuit 10 receive a differential signal Q, Q', which is buffered to drive signal OUT on line 10 suitable for driving a heavily loaded output, and particularly useful as an off-chip output pad driver. The state of differential input signal Q, Q', and an output enable signal ENABLE, is used to generate signals NPU and PD on the predrive output lines 12 and 14 respectively. Output enable signal ENABLE provides for a three-state output, including a high-impedance state ('floating'), a logic high state ('1'), and a logic low state ('0').

Predriver circuit 2 receives the logic signal Q and generates an associated pullup signal NPU on line 12 for driving the gate of the PFET 6 in the driver circuit 5. Pullup signal NPU is negative true in order to turn on the PFET 6 to electrically connect the transmission line 10 to the high voltage source $V_{DD}$ to drive the output signal OUT to a logic high state.

Predriver circuit 4 similarly receives the complement logic signal Q' and generates an associated pulldown signal PD for driving the gate of the NFET 8 in the driver circuit 5. Pulldown signal PD is positive true in order to turn on the NFET 8 to electrically connect the transmission line 10 to the low voltage source $V_{SS}$ to drive the output signal OUT to a logic low state.

When disabled by output enable signal ENABLE, predriver circuits 2 and 4 disable their respective predriver circuits 2 and 4 such that their output signals NPU and PD do not track the input signals Q and Q'.

When the transmission line 10 is connected to one of the voltage sources $V_{DD}$, $V_{SS}$, the transmission line 10 is being "driven" by the driver circuit 5. Associated with the driving of the transmission line 10 is the charging time of the pullup and pulldown switching devices PFET 6 and NFET 8. The charging time as defined herein is the length of time required to turn on the pullup and pulldown switching devices 6 and 8 from a fully off state. In the illustrative embodiment, the charging time is the amount of time required cause the PFET 6 and NFET 8 to reach saturation from a fully off state.

Figure 2A:
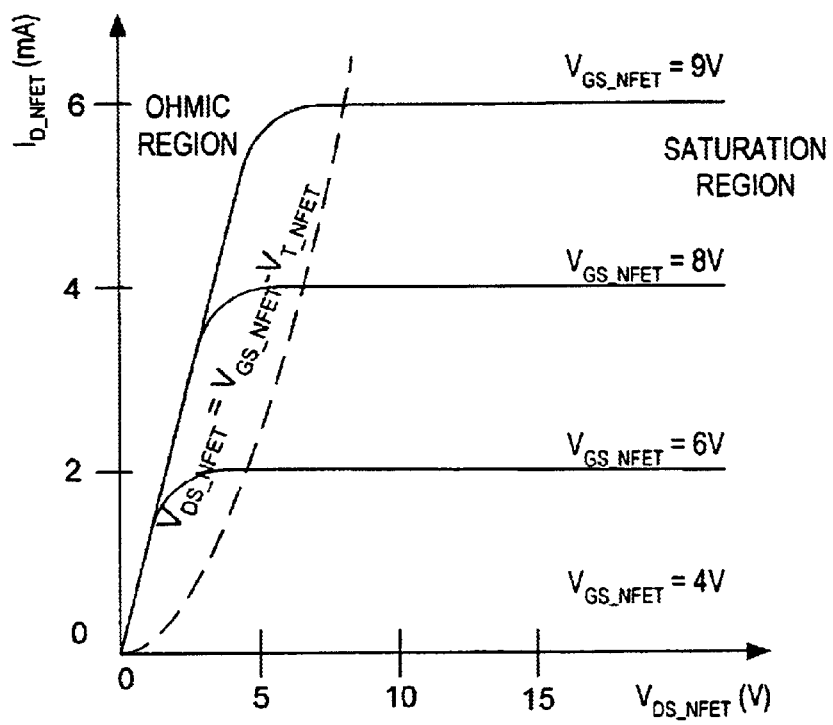
FIG. 2A is a drain characteristics plot of a conventional NFET device.
Figure 2B:
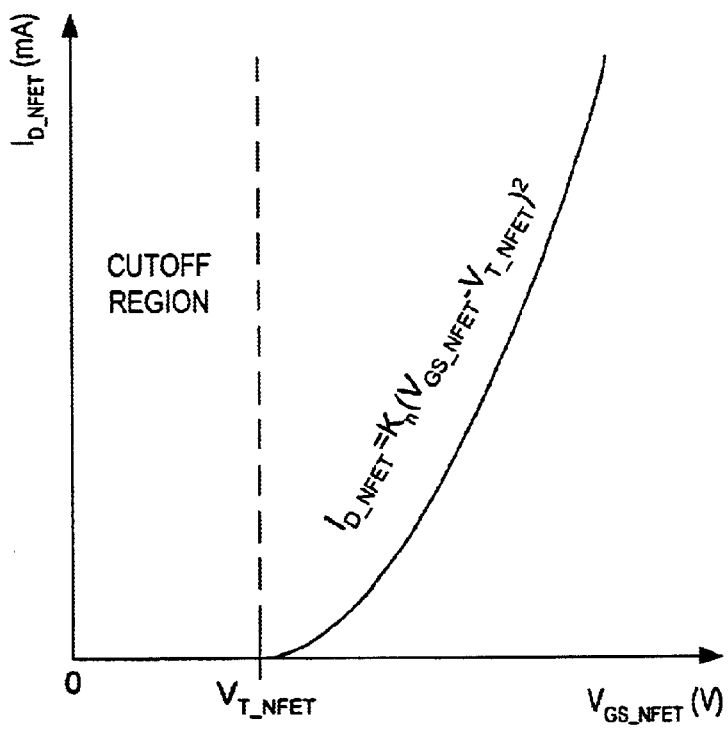
FIG. 2B is a transfer characteristics plot of a conventional NFET device.

FIG. 2A is a drain characteristics plot and FIG. 2B is a transfer characteristics plot of a conventional NFET device. As illustrated, the conventional NFET operates in one of three regions according to the voltage $V_{GS}$ applied at the gate. These regions are known as the "ohmic" or "linear" region, the "saturation" region, and the "cutoff" region.

FIG. 2A illustrates that in the linear region, the voltage seen at the drain $V_{DS}$ is equal to the gate voltage $V_{GS\_NFET}$ less the turn-on threshold voltage $V_{T\_NFET}$ of the NFET device (i.e., $V_{DS\_NFET}=V_{GS\_NFET}-V_{T\_NFET}$). As illustrated in FIG. 2A, while the drain voltage $V_{DS}$ is linear in this region, FIG. 2B illustrates that the drain current $I_D$ in the linear region follows an exponential curve defined by $I_{D\_NFET}=K_n(V_{GS\_NFET}-V_{T\_NFET})^2$.

As further illustrated in FIG. 2A, when $V_{DS\_NFET} \geq V_{GS\_NFET}-V_{T\_NFET}$, the drain current $I_{D\_NFET}$ is constant, and the voltage $V_{DS\_NFET}$ on the drain cannot increase due to the drain current $I_{D\_NFET}$. This region is known as the "saturation" region.

As illustrated in FIG. 2B, when $V_{GS\_NFET}$ is less than the turn-on threshold voltage $V_{T\_NFET}$ Of the NFET device (i.e., $V_{GS\_NFET}<V_{T\_NFET}$), the drain current $I_{D\_NFET}$ is zero ($I_{D\_NFET}=0$) and therefore the device is off. This region is known as the "cutoff" region. Because $I_{D\_NFET}=0$ until the gate voltage $V_{GS\_NFET}$ reaches the turn-on threshold voltage $V_{T\_NFET}$, a setup time $\Delta T_{T\_NFET}$ elapses before the voltage $V_{D\_NFET\_S}$ at the drain even begins to rise. The length of the setup time $\Delta T_{T\_NFET}$ depends on the value of the turn-on threshold voltage $V_{T\_NFET}$ and strength of the devices driving the gate.

Figure 2C:
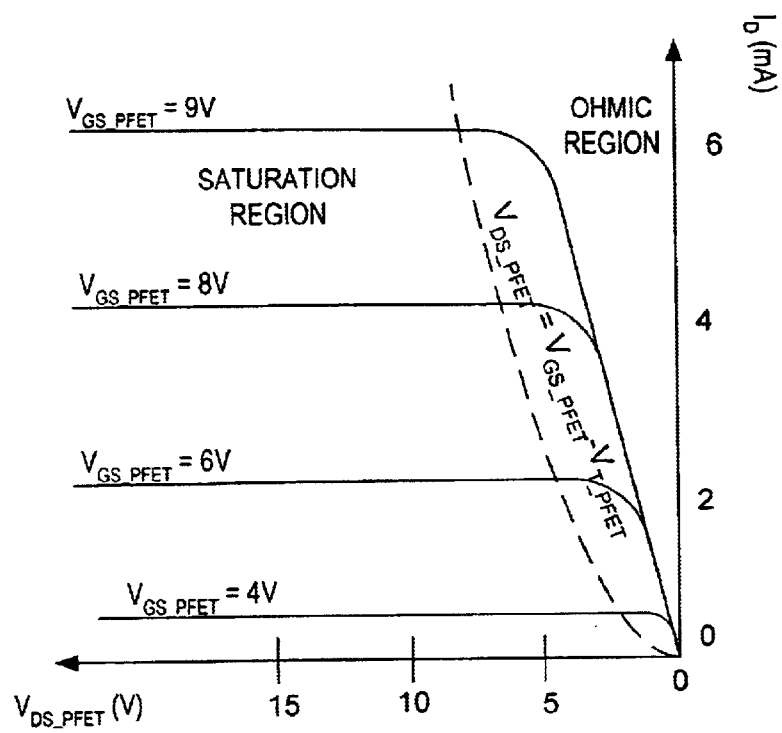
FIG. 2C is a drain characteristics plot of a conventional PFET device.
Figure 2D:
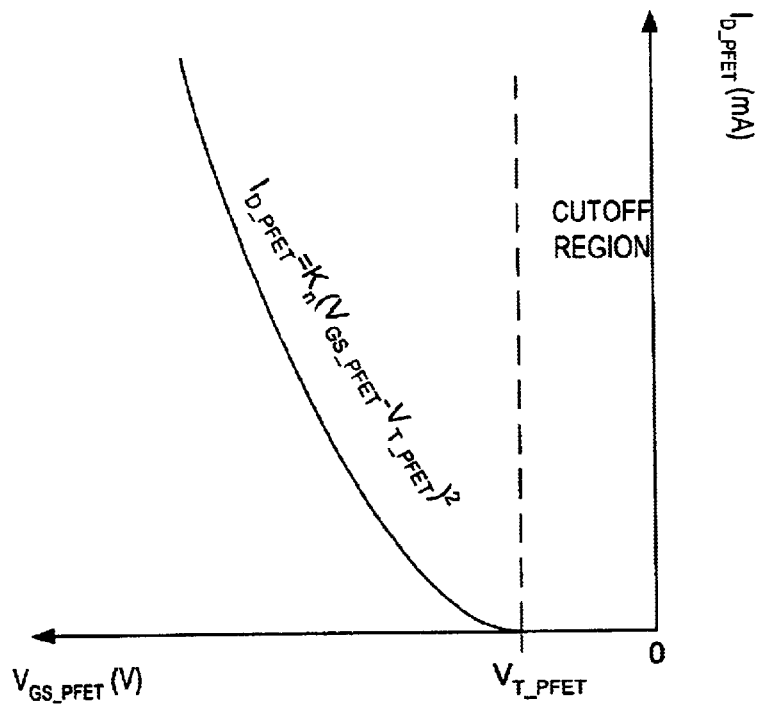
FIG. 2D is a transfer characteristics plot of a conventional PFET device.

FIG. 2C is a drain characteristics plot and FIG. 2D is a transfer characteristics plot of a conventional PFET device. FIG. 2A illustrates that in the linear region, the voltage seen at the drain $V_{DS\_PFET}$ is equal to the gate voltage $V_{GS\_PFET}$ less the turn-on threshold voltage $V_{T\_PFET}$ of the PFET device (i.e., $V_{DS\_PFET}=V_{GS\_PFET}-V_{T\_PFET}$). As illustrated in FIG. 2C, while the drain voltage $V_{DS\_PFET}$ is linear in this region, FIG. 2D illustrates that the drain current $I_{D\_PFET}$ in the linear region follows an exponential curve defined by $I_{D\_PFET}=K_n(V_{GS\_PFET}-V_{T\_PFET})^2$.

As further illustrated in FIG. 2C, when the PFET device is the "saturation" region, $V_{DS\_PFET} \geq V_{GS\_PFET}-V_{T\_PFET}$, the drain current $I_{D\_PFET}$ is constant, and the voltage $V_{DS\_PFET}$ on the drain cannot increase due to the drain current $I_{D\_PFET}$.

As illustrated in FIG. 2D, the cutoff region occurs when $V_{GS\_PFET}$ is less than the turn-on threshold voltage $V_{T\_PFET}$ Of the PFET device (i.e., $V_{GS\_PFET}<V_{T\_PFET}$), the drain current $I_D$ is zero ($I_D=0$) and therefore the device is off. As with the NFET device discussed earlier, because $I_{D\_PFET}=0$ until the gate voltage $V_{GS\_PFET}$ reaches the turn-on threshold voltage $V_{T\_PFET}$, a setup time $\Delta T_{T\_PFET}$ elapses before the voltage $V_{DS\_PFET}$ at the drain even begins to rise. The length of the setup time $\Delta T_{T\_PFET}$ depends on the value of the turn-on threshold voltage $V_{T\_PFET}$ and strength of the devices driving the gate.

Referring back to FIG. 1, the setup time $\Delta T_{T\_PFET}$, $\Delta T_{T\_NFET}$ for turning on pullup PFET 6 and pulldown NFET 8 is essentially lost time since the devices 6, 8 do not even begin to turn on until a time $\Delta T_{T\_PFET}$, $\Delta T_{T\_NFET}$ elapses to allow the respective voltage level of pullup signal PU on line 12 and pulldown signal PD on line 14 to reach their respective turn-on threshold voltages $V_{T\_PFET}$, $V_{T\_NFET}$. Depending on the size/strength of the pre-driver devices (not shown) and driver devices 6, 8, and the value of the turn-on threshold voltages $V_{T\_PFET}$, $V_{T\_NFET}$ of driver devices 6, 8, the setup times $V_{T\_PFET}$, $V_{T\_NFET}$ may be fairly lengthy. The invention utilizes this "lost" time to allow for a slower slew rate on the transmission line 10 without having to sacrifice signal speed.

Figure 3:
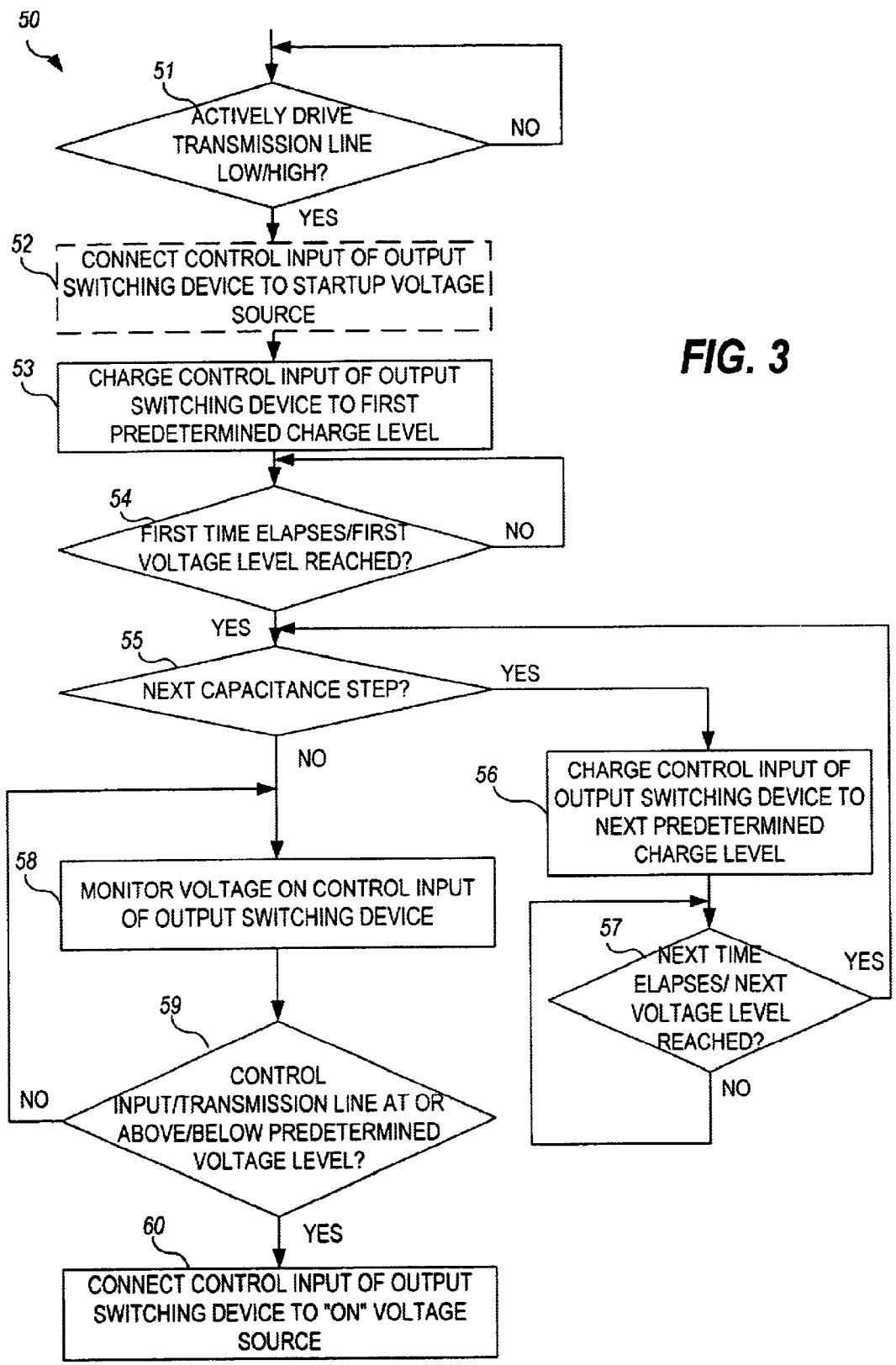
FIG. 3 is an operational flowchart of the method of the invention.

Turning now to FIG. 3, there is shown a flowchart illustrating a first embodiment of a method 50 in accordance with the invention. As illustrated, when the transmission line signal is to be actively driven to a low/high state by an output switching device characterized by an "on" threshold voltage, as monitored in a step 51, a startup voltage source generating a startup voltage $V_{STARTUP}$ at or near the threshold voltage of the output switching device is optionally connected 52 to the control input of the output switching device. This step 52 prepares the output switching device to turn on, avoiding the setup time ATT latency caused by linearly ramping the charge on the control input of the output switching device.

Once the control input of the output switching device reaches the startup voltage level $V_{STARTUP}$, or if this optional step is not performed, the control input of the output switching device is charged 53 to a first charge level. In the preferred embodiment, this step 53 is performed by connecting a predetermined first capacitance in a switched capacitance sequence comprising a plurality of capacitance steps to the control input of the output switching device. The predetermined first capacitance is selected such that the predrive signal on the control input of the output switching device increases by an increment $\Delta V_1$ from the startup voltage $V_{STARTUP}$.

After a predetermined first time, or alternatively, when the transmission line reaches a predetermined first voltage level, as determined in step 54, if a next sequential step exists in the charging sequence (determined in step 55), the control input of the output switching device is charged 56 to a next predetermined charge level. Preferably, this step is performed by connecting a predetermined next higher/lower capacitance in the switched capacitance sequence to the control input of the output switching device. The predetermined next capacitance in the switched capacitance sequence is selected such that the predrive signal on the control input of the output switching device increases/decreases by an increment $\Delta V_{next}$ from the startup voltage $V_{STARTUP}$.

After a predetermined next time, or alternatively, when the transmission line reaches a predetermined next voltage level, as determined in step 57, if a next step exists in the charging sequence (determined in step 55), steps 56, 57, and 55 are repeated.

If a next step does not exist (as determined in step 55), the voltage level on the control input of the output switching device is monitored 58. When the voltage level reaches a predetermined level (e.g., device saturation), as detected in step 59, the control input of the output switching device is connected 60 to the "on" voltage source.

In a preferred embodiment, each charge step in the charging sequence comprises connecting a capacitance value of increasing/decreasing successive capacitance such that the transmission line signal exhibits a linear voltage ramp of desired slope.

Figure 4A:
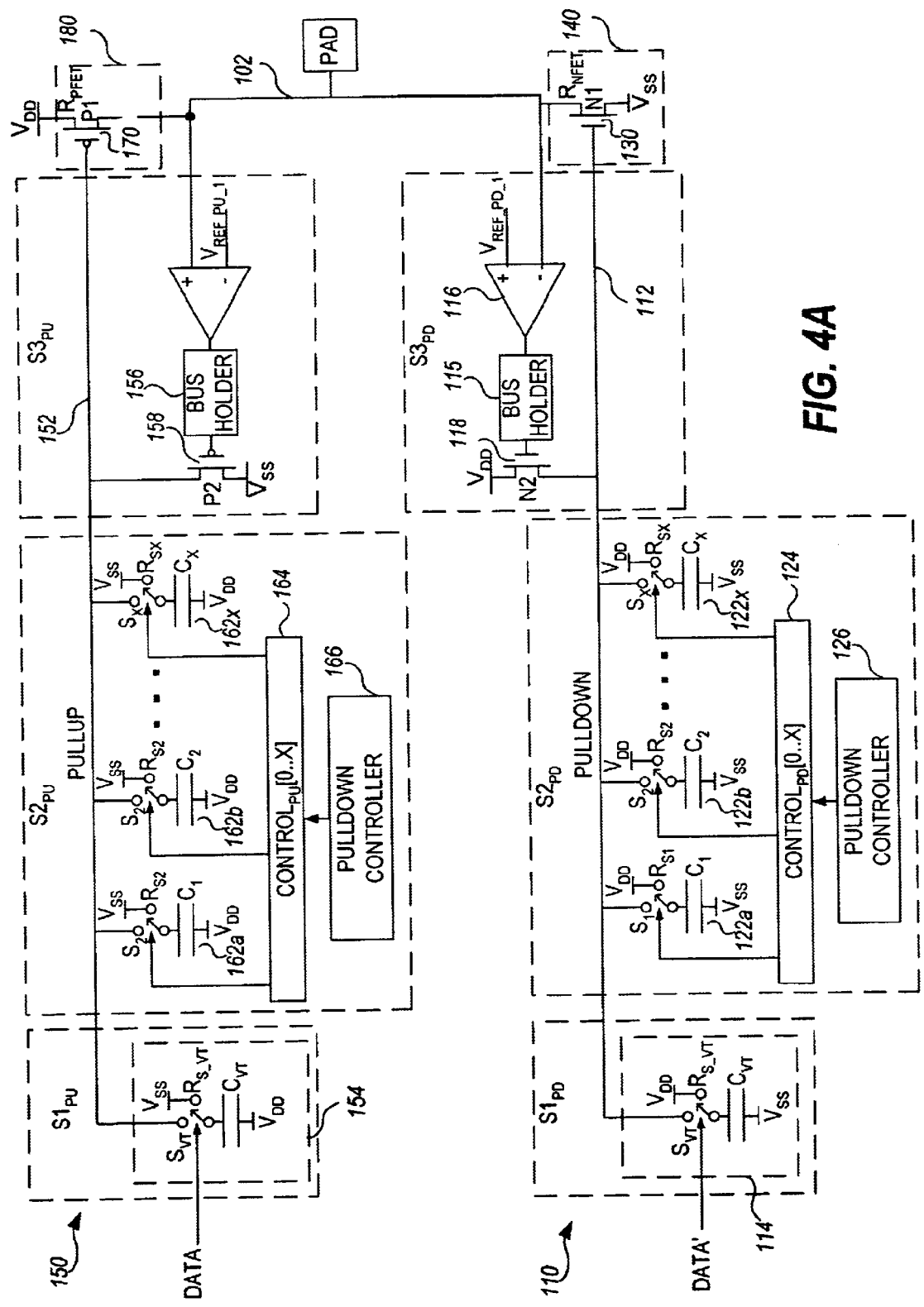
FIG. 4A is a schematic diagram of a preferred embodiment of an output buffer implemented in accordance with a first embodiment of the invention.

FIG. 4A is a schematic diagram of an exemplary embodiment of an output buffer 100 implemented in accordance with a first embodiment of the invention. Output buffer 100 comprises a pulldown predriver circuit 110 which drives a pulldown circuit 140 and a pullup predriver circuit 150 which drives a pullup circuit 180. Pulldown circuit 140 is preferably implemented with an NFET device 130 having a turn-on threshold voltage $V_{TH\_PD}$. NFET device 130 has a source connected to a low voltage source $V_{SS}$, a drain connected to the transmission line 102, and a gate connected to receive a positive true predrive signal PULLDOWN on a pulldown predrive line 112. Pullup circuit 180 is preferably implemented using a PFET device 170 having a turn-on threshold voltage $V_{TH\_PU}$. PFET device 170 has a source connected to a high voltage source $V_{DD}$, a drain connected to the transmission line 102, and a gate connected to receive a negative true predrive signal NPULLUP on a pullup predrive line 152.

Pullup and pulldown predriver circuits 150 and 110 respectively receive a logic true signal DATA and its complement DATA', whereby when logic signal DATA is in a high logic state, the transmission line 102 is driven to a high state, and when complement logic signal DATA' is in a high state, the transmission line 102 is driven to a low state.

Each predriver circuit 110 and 150 is configured in three stages, $S1_{PD}$, $S2_{PD}$, $S3_{PD}$, and $S1_{PU}$, $S2_{PU}$, $S3_{PU}$, respectively.

Turning first to the pulldown predriver circuit 110, there is shown a first pulldown stage $S1_{PD}$, a second pulldown stage $S2_{PD}$, and a third pulldown stage $S3_{PD}$. The first pulldown stage $S1_{PD}$ comprises a switched capacitor 114 connected between the low voltage source $V_{SS}$ and the pulldown predrive line 112 that controls the pulldown NFET device 130.

Switched capacitor 114 comprises a capacitor $C_{VT}$ switchably connectable between a low voltage source $V_{SS}$ and either a high voltage source VDD or the pulldown predriver line 112. The state of the switch $S_{VT}$ is determined by the value of complement logic signal DATA'. If input signal DATA' is in a low state, the switch $S_{VT}$ is connected to the high voltage source $V_{DD}$ where it charges to store an amount of charge Q=CVT*VDD. When input signal DATA' transitions to the high state, the switch $S_{VT}$ is connected to the pulldown predriver line 112. When connected to line 112 by switch $S_{VT}$, capacitor $C_{VT}$ supplies current to line 112 at a rate of I=$C_{VT}$*dv/dt, which ramps up the voltage level on line 112. In the present invention, capacitor $C_{VT}$ is scaled in size such that the capacitance C charges the pulldown predrive line 112 to a voltage $V_{S1\_PD}$ at or very near to the turn-on threshold voltage $V_{TH\_PD}$ of pulldown NFET device 130 within a time $T_{S1\_PD}$. Time $T_{S1\_PD}$ is an amount of time much less than the setup time $\Delta T_T$ for turning on pulldown NFET 130. In order to achieve $T_{S1\_PD} << \Delta T_{T\_NFET}$, the resistance $R_C$ on the switch $S_{VT}$ must be much less than the resistance $R_{NFET}$ of the pulldown NFET 130 (i.e., $R_C << R_{NFET}$).

The second pulldown stage $S2_{PD}$ comprises a controller 126 and a plurality of switched capacitors 122a, 122b, . . . , 122x, each switchably connectable between either the low voltage source $V_{SS}$ or the pulldown predrive line 112.

Preferably, the plurality of switched capacitors 122a, 122b, . . . , 122x are weighted to implement either a binary code, whereby each switched capacitor leg of the pulldown stage $S2_{PD}$ comprises a capacitance value corresponding to its binary weighted bit position in the sequence of switched capacitor legs, or a thermometer code, whereby when an nth-order signal $W_n$ is activated (connected to pulldown predriver line 112) all of the lower-order signals $W_1$ to $W_{n-1}$ are also activated. It will be appreciated by those skilled in the art that the number of switched capacitors and the capacitance value of each switched capacitor may vary according to a given design or application; however, the invention applies to and is intended to cover all such variations.

Controller 126 operates to sequentially connect the plurality of switched capacitors 122a, 122b, . . . , 122x to the pulldown predriver line 112 according to a switched capacitance sequence comprising a plurality of capacitance steps.

In the preferred embodiment, the capacitance steps preferably increase in capacitance for each step in the sequence. Thus, the voltage on pulldown predriver line 112 increases with each step in the switched capacitance sequence.

Preferably, the controller 126 is programmable to allow selection of a combination of switched capacitors to supply a preferred combined parallel capacitance that results in a step-wise linear signal of a desired slope on pulldown predrive line 112 during the time that pulldown stage $S2_{PD}$ is active. To this effect, controller 126 outputs a digital word $CONTROL_{PD}$ 124 whereby each bit of the control word drives one of the plurality of switched capacitors 122a, 122b, ..., 122x.

Figure 4B:
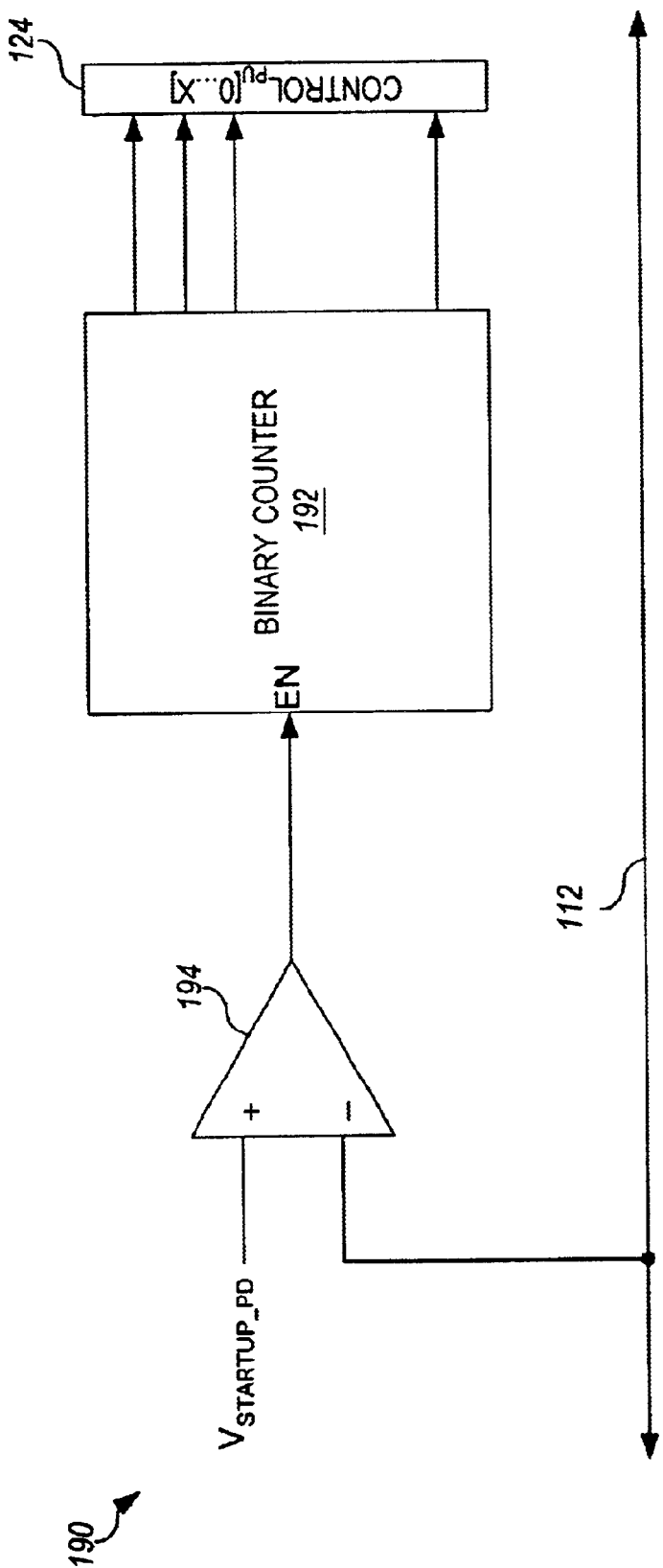
FIG. 4B is a schematic block diagram of a controller used in the embodiment of FIG. 4A.

FIG. 4B is a schematic block diagram of an embodiment of a controller 190 that could be used for controller 126 when the plurality of switched capacitors 122a, 122b, ..., 122x implements a binary code. In this embodiment, controller 190 includes a saturating binary counter 192 (i.e., it does not roll over from the highest output to the lowest) that is enabled by comparator 194 which starts the counter 192 when predrive line 112 equals the startup voltage $V_{STARTUP\_PD}$.

The third pulldown stage $S3_{PD}$ comprises a feedback circuit to monitor the voltage level on the transmission line 102 and to quickly pull the voltage on the transmission line 102 to the low state when it reaches a predetermined voltage level. In the preferred embodiment, third pulldown stage $S3_{PD}$ comprises a comparator 116 having first input connected to the transmission line 102 and a second input connected to receive a pulldown reference signal $V_{REF\_PD}$. Comparator 116 has an output connected to feed the gate of a low-resistance NFET device 118 that is connected in drain-source relationship between the pulldown predrive line 112 and the high voltage source $V_{DD}$.

The operation of the pulldown predriver circuit 110 will now be discussed in conjunction with the signal diagram of FIG. 5A. When complementary logic signal DATA' transitions to a high state, switched capacitor 114 is connected to pulldown predrive line 112. The connection allows current to flow through the capacitor 114, such that the charge stored in the capacitor 114 raises the voltage on pulldown predrive line 112 to a voltage $V_{S1\_PD}$ at or very near the turn-on threshold voltage $V_{TH\_PD}$ of pulldown NFET device 130 within a time $T_{S1\_PD}$. The resistance $R_C$ of the switch is much less than the resistance of $R_{NFET}$ of the pulldown NFET device 130 such that time $T_{S1\_PD}$ is an amount of time much less than the setup time $\Delta T_T$ for turning on pulldown NFET device 130.

Simultaneously, or within a short time thereafter, a selected combination of the plurality of switched capacitors 122a, 122b, ..., 122x, is connected to the pulldown predrive line 112. The combined parallel capacitance $C_{PD}$ of the selected resistive devices results in a current flowing onto the line 112 to ramp up the voltage on line 112 by an amount proportional to the amount of charge stored in the selected combination of connected capacitors 122a, 122b, ..., 122x.

Figure 5A:
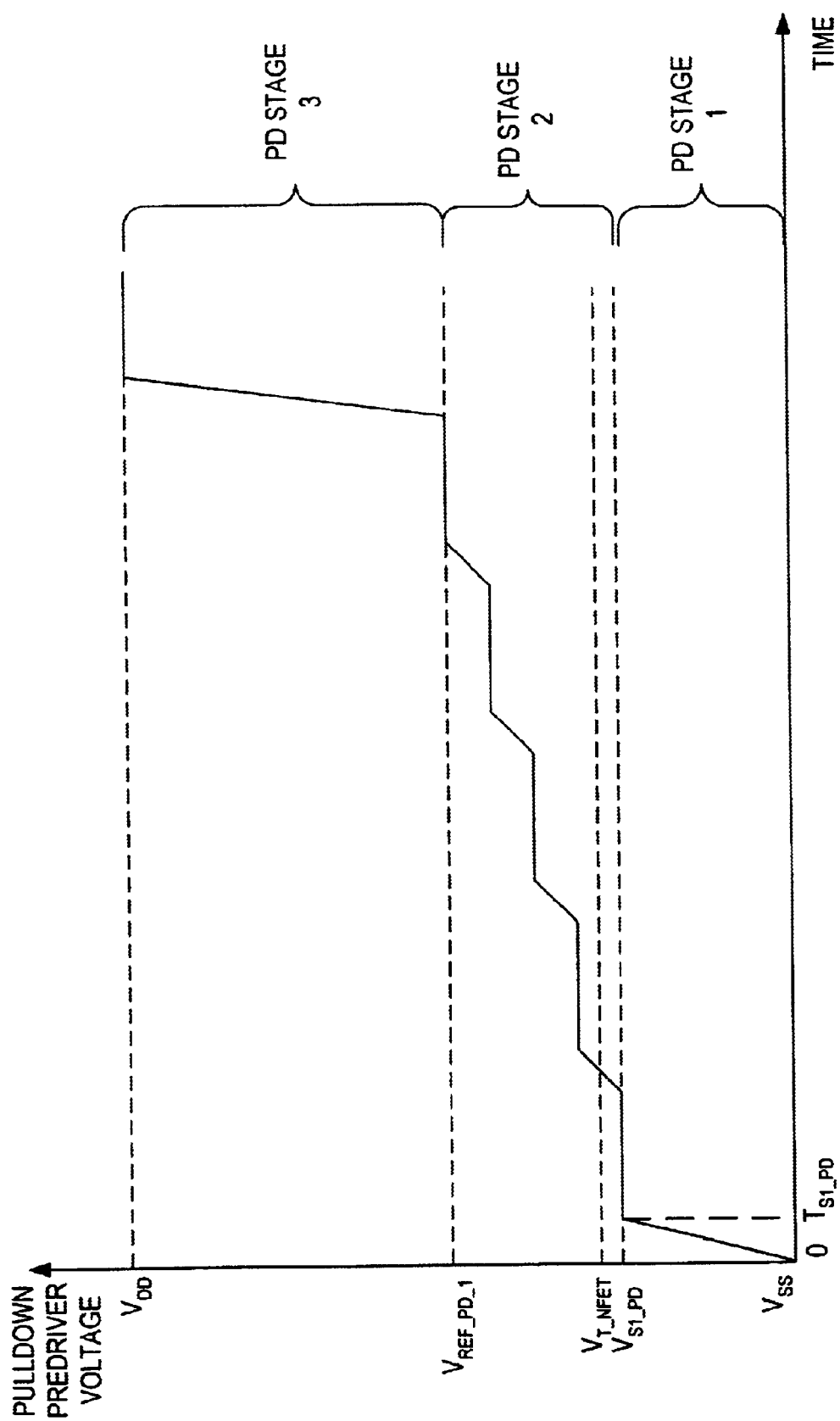
FIG. 5A is a waveform diagram illustrating a pulldown predriver signal produced by the output buffer of FIG. 4A.

As illustrated in FIG. 5A where indicated by callout Stage 2, the lower the combined parallel capacitance of the selected switched capacitors 122a, 122b, ..., 122x, the slower the slew rate (i.e., lower slope) of the signal transition. Significantly, the slew rate control of the pre-drive signal PD occurs in the linear region of the pulldown NFET device 130. In particular, the longer the amount of time the pulldown NFET device 130 spends in its linear region, the slower the slew rate of the signal output on the transmission line 102 by pulldown NFET device 130 will be. This is achieved by slowing the slew rate of the pulldown predrive signal PULLDOWN seen on the control input of the driver NFET device 130. In other words, all slew rate control must happen while the pulldown NFET device is in its linear region.

For this reason, and since $V_{DS} \geq V_{GS} - V_T$, once the voltage level on the pulldown predrive line 112 reaches $V_{DS} \geq V_{GS} - V_T = V_{REF\_PD\_1}$, the pulldown NFET device 130 will have reached saturation. Stage 3 allows for quickly pulling the transmission line to the rail after reaching saturation in order to allow for the slowest slew rate without comprising switching speed. Accordingly, in operation, comparator 116 monitors the signal on the transmission line 102 and compares it to the reference signal $V_{REF\_PD\_1}$. If the voltage level on the transmission line 102 reaches $V_{REF\_PD\_1}$, the comparator 116 outputs a logic high on the gate of low-resistance NFET device 118. In turn, the NFET device 118 turns on and quickly pulls the voltage on the predrive line 112 to the $V_{DD}$ rail. A bus holder 115 maintains the signal on pulldown predriver line 112 when the predriver line 112 is not actively driven.

In the alternative, as shown in FIG. 4B, comparator 116 has one input connected to the predrive line 112. Since $V_{DS} \geq V_{GS} - V_T$, once the voltage level on the pulldown predrive line 112 reaches $V_{GS} = V_{DS} + V_T = V_{REF\_PD\_2}$, the pulldown NFET device will have reached saturation. In this embodiment, comparator 116 monitors the signal on the predrive line 112 and compares it to the reference signal $V_{REF\_PD\_2}$. If the voltage level on the predrive line 112 reaches $V_{REF\_PD\_2}$, the comparator 116 outputs a logic high on the gate of low-resistance NFET device 118. In turn, the NFET device 118 turns on and quickly pulls the voltage on the predrive line 112 to the $V_{DD}$ rail.

FIG. 5A thus illustrates that after an elapse of time $T_{S1\_PD}$ (much less than the setup time $\Delta T_{T\_NFET}$ for turning on pulldown NFET 130), the voltage on pulldown predrive line 112 is quickly charged to a level $V_{S1\_PD}$ at or very near to the turn-on threshold voltage $V_{T\_PD}$ of pulldown NFET device 130, as indicated by the callout Stage 1. The predrive line 112 is then sequentially charged by stepwise increasing capacitance to result in a controlled slope of the transmission signal transition, as indicated by the callout Stage 2. Once the voltage level on the transmission line reaches a predetermined value $V_{REF\_PU\_1}$ (e.g., the saturation voltage), the predrive line 112 is quickly pulled to the high voltage level $V_{DD}$, as indicated by the callout Stage 3.

Turning now to the pullup predriver circuit 110, there is shown a first pullup stage $S1_{PU}$, a second pullup stage $S2_{PU}$, and a third pullup stage $S3_{PU}$. The first pullup stage $S1_{PU}$ comprises a switched capacitor 154 connected between the high voltage source $V_{DD}$ and the pullup predrive line 152.

Switched capacitor 154 comprises a capacitor $C_{VT}$ switchably connectable between the high voltage source $V_{DD}$ and either the low voltage source $V_{SS}$ or the pullup predriver line 152. The state of the switched capacitor 154 is determined by the value of logic signal DATA.

The second pullup stage $S2_{PU}$ comprises a pullup controller 166 and a plurality of switched capacitors 162a, 162b, ..., 162x, each switchably connectable between either the high voltage source $V_{DD}$ or the pullup predrive line 152.

Preferably, the plurality of switched capacitors 162a, 162b, ..., 162x are weighted to implement either a binary code or a thermometer code.

Controller 166 operates to sequentially connect the plurality of switched capacitors 162a, 162b, ..., 162x to the pullup predriver line 152 according to a switched capacitance sequence comprising a plurality of capacitance steps. In the preferred embodiment, the capacitance steps preferably decrease in capacitance for each step in the sequence. Thus, the voltage on pullup predriver line 152 decreases with each step in the switched capacitance sequence.

Preferably, the controller 166 is programmable to allow selection of a combination of switched capacitors to supply a preferred combined parallel capacitance that results in a step-wise linear signal of a desired slope on pullup predrive line 152 during the time that pullup stage $S2_{PU}$ is active. To this effect, controller 166 outputs a digital word $CONTROL_{PU}$ 164 whereby each bit of the control word drives one of the plurality of switched capacitors 162a, 162b, . . . , 162x.

The third pullup stage $S3_{PU}$ comprises a comparator 156 having first input connected to the transmission line 102 and a second input connected to receive a pullup reference signal $V_{REF\_PU}$, and an output connected to feed the gate of a low-resistance PFET device 158 that is connected in drain-source relationship between the pullup predrive line 152 and the low voltage source $V_{DD}$.

Figure 5B:
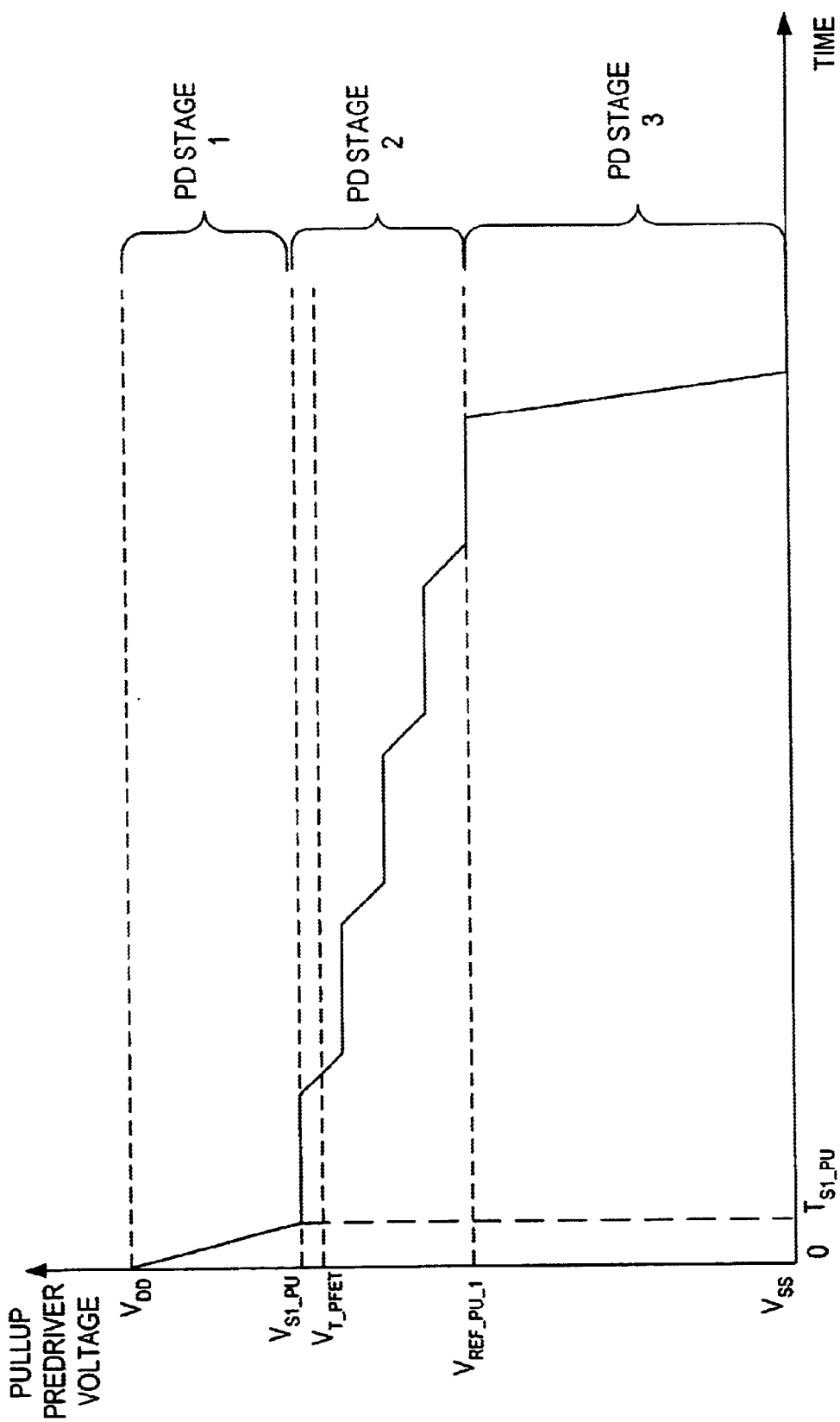
FIG. 5B is a waveform diagram illustrating a pullup predriver signal produced by the output buffer of FIG. 4A.

FIG. 5B illustrates that the pullup predriver circuit 150 operates similarly to that of the pulldown predriver circuit 110, except that the voltage on the pullup predriver line 152 transitions from high to low. In particular, after an elapse of time $T_{S1\_PU}$ (much less than the setup time $\Delta T_{T\_PFET}$ for turning on pullup PFET 170), the voltage on pullup predrive line 152 is quickly charged to a level $V_{STARTUP\_PU}$ at or very near to the turn-on threshold voltage $V_{T\_PD}$ of pulldown NFET device 130, as indicated by the callout Stage 1. The predrive line 152 is then sequentially discharged by stepwise decreasing the capacitance to result in a controlled slope of the transmission signal transition, as indicated by the callout Stage 2. Once the voltage level on the transmission line reaches a predetermined value $V_{REF\_PU\_1}$ (e.g., the saturation voltage), the predrive line 152 is quickly pulled to the low voltage level $V_{DD}$ with a low-resistance FET, as indicated by the callout Stage 3.

Figure 6:
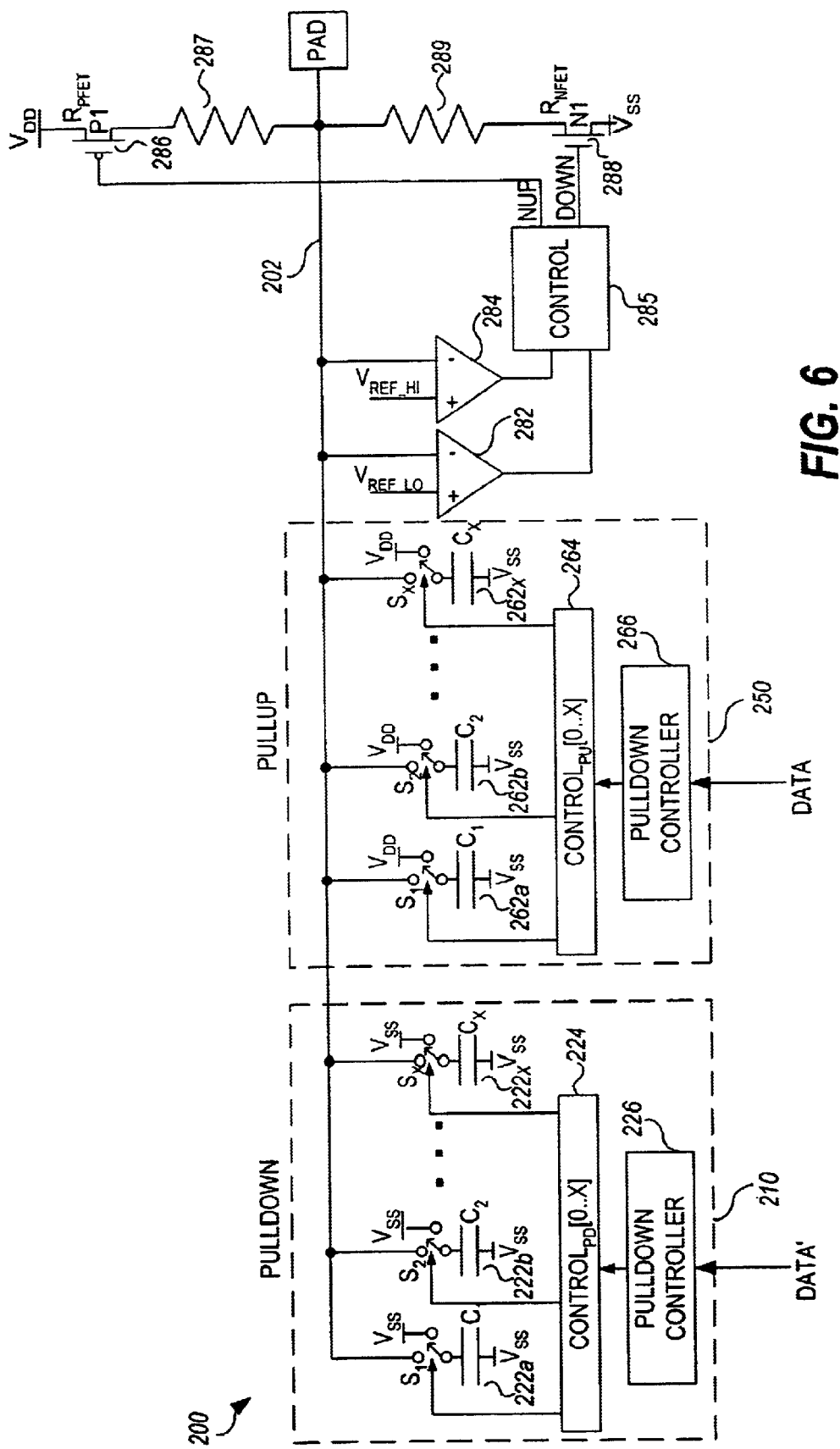
FIG. 6 is a schematic diagram of a preferred embodiment of an alternative embodiment of an output buffer implemented in accordance with a second embodiment of the invention.

FIG. 6 is a schematic diagram of a second embodiment of an output buffer 200 implemented in accordance with the invention. Output buffer 200 comprises a pulldown predriver circuit 210 and a pullup predriver circuit 250.

Pulldown predriver circuit 210 comprises a controller 226 and a plurality of switched capacitors 222a, 222b, . . . , 222x, each switchably connectable between either the low voltage source $V_{SS}$ or the transmission line 202.

Pullup predriver circuit 250 comprises a controller 266 and a plurality of switched capacitors 262a, 262b, . . . , 262x, each switchably connectable between either the high voltage source $V_{DD}$ or the transmission line 202.

Preferably, the plurality of switched capacitors 222a, 222b, . . . , 222x in pulldown predriver circuit 210 and the plurality of switched capacitors 262a, 262b, . . . , 262x in pullup predriver circuit 250 are weighted to implement either a binary code, whereby each switched capacitor leg of the pulldown stage $S2_{PD}$ comprises a capacitance value corresponding to its binary weighted bit position in the sequence of switched capacitor legs, or a thermometer code, whereby when an nth-order signal $W_n$ is activated (connected to transmission line 202) all of the lower-order signals $W_1$ to $W_{n-1}$ are also activated. It will be appreciated by those skilled in the art that the number of switched capacitors and the capacitance value of each switched capacitor may vary according to a given design or application; however, the invention applies to and is intended to cover all such variations.

Controller 226 and 266 each respectively operate to sequentially connect the plurality of switched capacitors 222a, 222b, . . . , 222x, or 262a, 262b, . . . , 262x to the transmission line 202 according to a switched capacitance sequence comprising a plurality of capacitance steps. In the preferred embodiment, the capacitance steps preferably increase/decrease in capacitance for each step in the sequence. Thus, the voltage on transmission line 202 increases/decreases with each step in the switched capacitance sequence.

Preferably, the controller 226/266 is programmable to allow selection of a combination of switched capacitors to supply a preferred combined parallel capacitance that results in a step-wise linear signal of a desired slope on transmission line 202. To this effect, controller 226/266 outputs a digital word $CONTROL_{PD}$ 224/$CONTROL_{PU}$ 264 whereby each bit of the control word drives one of the plurality of switched capacitors 222a, 222b, . . . , 222x, or 262a, 262b, . . . , 262x.

For example, when the plurality of switched capacitors 222a, 222b, . . . , 222x, or 262a, 262b, . . . , 262x implement a binary code, controller 226/266 could comprise a binary counting controller as shown in FIG. 4B.

Output buffer 200 also includes a bus holder circuit 280 which holds the state of the transmission line 202 when it is not actively driven by predriver circuits 210 or 250. Bus holder circuit 280 implements a feedback control circuit for monitoring the voltage on the transmission line 202, and actively pulling the line 202 to a high or low voltage level depending on the current voltage level detected on the line 202. In the illustrative embodiment, the bus holder circuit 280 comprises a first comparator 282 having a positive input connected to receive a low reference voltage $V_{REFLO}$ and a negative input connected to the transmission line 202. When the voltage level on transmission line 202 is below the low reference voltage $V_{REFLO}$, the comparator 282 outputs a logic true signal (high voltage level). Bus holder circuit 280 also comprises a second comparator 284 having a positive input connected to receive a high reference voltage $V_{REFHI}$ and a negative input connected to the transmission line 202. When the voltage level on transmission line 202 is above the high reference voltage $V_{REFHI}$, the comparator 284 outputs a logic true signal (high voltage level).

Bus holder circuit 280 also includes a controller 285 which receives the outputs of the comparators 282 and 284. Controller 285 generates a negative true predrive high signal NUP which drives the gate of a PFET device 286, and a positive true predrive low signal DOWN which drives the gate of an NFET device 288. When the signal on the line 202 is below the low threshold voltage, both comparators 282 and 284 output a high voltage level. Accordingly, negative true predrive high signal NUP is false and therefore PFET device 286 is maintained in an OFF state. In constrast, positive true predrive low signal DOWN is true, thereby turning on NFET device 288 to pull down the signal on line 202 across resistor 289 to a pulldown impedance of $R_{DOWN}$.

When the signal on the line 202 crosses from below the low threshold voltage to above the low threshold, comparator 282 outputs a low voltage level and comparator 284 outputs a high voltage level. Accordingly, both predrive signals NUP and DOWN are false and therefore both PFET device 286 and NFET device 288 are maintained in an OFF state. This allows the signal level on the line 202 to be entirely driven by the pulldown and pullup predriver circuits 210 and 250.

When the signal on the line 202 crosses above the high threshold voltage, both comparators 282 and 284 output a low voltage level. Accordingly, positive true predrive low signal DOWN is false and therefore NFET device 288 is maintained in an OFF state. Negative true predrive high signal NUP is true, however, thereby turning on PFET device 286 to pull up the signal on line 202 across resistor 287 to a pullup impedance of $R_{UP}$.

Figure 7A:
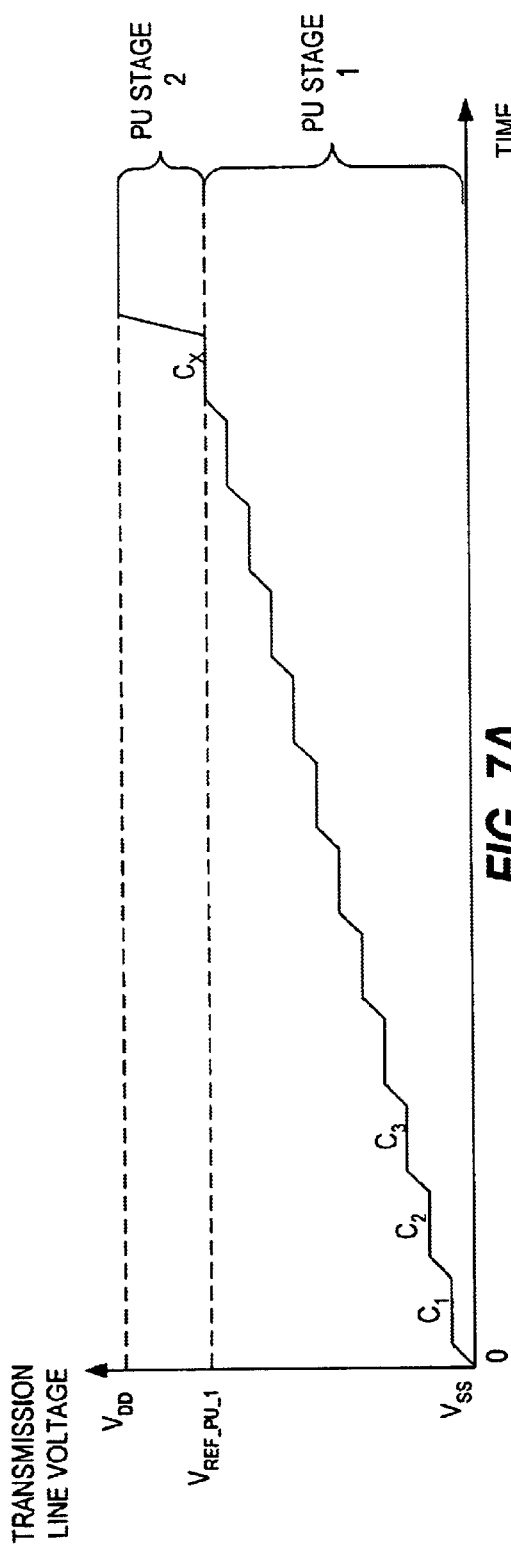
FIGS. 7A and 7B is a waveform diagram illustrating the transmission line signal generated by the output buffer of FIG. 6.
Figure 7B:
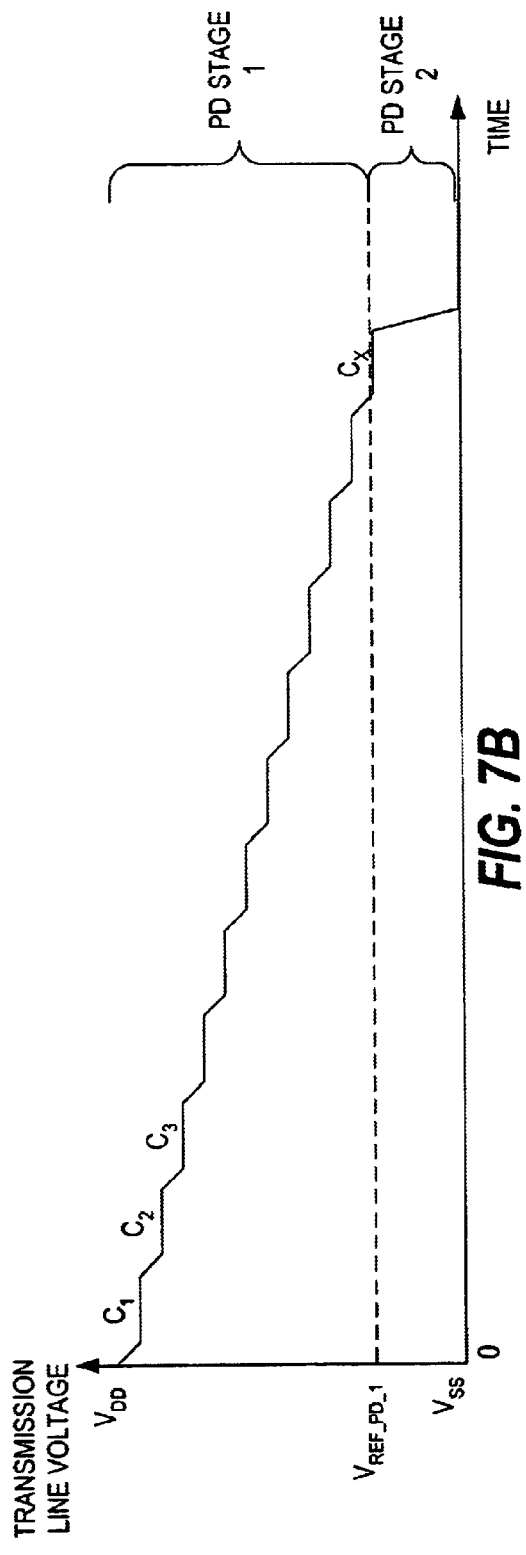

FIG. 7 is a waveform diagram illustrating the signal on the transmission line 202 transitioning from low to high, and then from high to low. As illustrated, transmission line 202 is sequentially charged by stepwise increasing capacitance to result in a controlled slope of the transmission signal transition, as indicated by the callout Pullup Stage 1. Once the voltage level on the transmission line reaches a predetermined value $V_{REF\_PU\_1}$ (e.g., the saturation voltage), the transmission line 202 is quickly pulled to the high voltage level $V_{DD}$, as indicated by the callout Pullup Stage 2. When transitioning from high to low, transmission line 202 is sequentially discharged by stepwise decreasing capacitance to result in a controlled slope of the transmission signal transition, as indicated by the callout Pulldown Stage 1. Once the voltage level on the transmission line reaches a predetermined value $V_{REF\_PD\_1}$, the transmission line 202 is quickly pulled to the low voltage level $V_{SS}$, as indicated by the callout Pulldown Stage 2.

The slew rate on the transmission line 202 may be varied simply by changing the amount of capacitance (i.e., combination of switched capacitors) connected to the line 202 and the amount of time each capacitor is allowed to charge/discharge.

In will be appreciated by those skilled in the art that other components, for example programmable transistor current sources, may be used in place of the switched capacitors for ramping the voltage up or down on the transmission line. The slew rate on the transmission line 202 may be varied simply by changing the amount of current flow to the line 202 and the amount of time the current flows at each step.

While illustrative and presently preferred embodiments of the invention have been described in detail herein, it is to be understood that the inventive concepts may be otherwise variously embodied and employed and that the appended claims are intended to be construed to include such variations except insofar as limited by the prior art.

What is claimed is:

1. A method for reducing the slew rate of a signal on a transmission line driven by an output switching device, said output switching device characterized by a turn-on threshold voltage and comprising a control input responsive to a predrive signal for placing said output switching device in one of an OFF state, a linear state, or an ON state, wherein: said output switching device is in said OFF state not driving said transmission line when said predrive signal is at a voltage level between said turn-on threshold voltage and an OFF voltage level; said output switching device is in a linear state driving said transmission line to a voltage level proportional to said predrive signal when said predrive signal is at a voltage level between said turn-on threshold voltage and a saturation voltage level; and said output switching device is in said ON state driving said transmission line to predetermined constant voltage level when said predrive signal is at a voltage level between said saturation voltage level and said ON voltage level, said method comprising:

connecting a predetermined first capacitance in a switched capacitance sequence comprising a plurality of capacitance steps to the control input of said output switching device;

determining whether a next sequential capacitance step exists in said switched capacitance sequence;

if a next sequential capacitance step exists in said switched capacitance sequence, connecting a predetermined next capacitance in said switched capacitance sequence to said control input of said output switching device;

repeating said determining step through said repeating step until no next sequential capacitance step exists in said switched capacitance sequence;

monitoring a voltage level on at least one of said control input of said output switching device and said transmission line; and when said monitored voltage level reaches a predetermined reference voltage, connecting said control input of said output switching device to said ON voltage source.

2. A method in accordance with claim 1, comprising, performing a first step of connecting the control input of said output switching device to a startup voltage source at or near said turn-on threshold voltage.

3. A method in accordance with claim 1, comprising:

varying a slew rate on said transmission line by changing an amount of time between said sequential capacitance steps.

4. A method in accordance with claim 1, comprising:

varying a slew rate on said transmission line by changing the amount of capacitance connected for at least one of said sequential capacitance steps.

5. A method in accordance with claim 1, wherein:

said switched capacitance steps in said switched capacitance sequence result in a linear slew rate on said transmission line.

6. A method for reducing the slew rate of a signal on a transmission line driven by an output switching device, said output switching device characterized by a turn-on threshold voltage and comprising a control input responsive to a predrive signal for placing said output switching device in one of an OFF state, a linear state, or an ON state, wherein: said output switching device is in said OFF state not driving said transmission line when said predrive signal is at a voltage level between said turn-on threshold voltage and an OFF voltage level; said output switching device is in a linear state driving said transmission line to a voltage level proportional to said predrive signal when said predrive signal is at a voltage level between said turn-on threshold voltage and a saturation voltage level; and said output switching device is in said ON state driving said transmission line to predetermined constant voltage level when said predrive signal is at a voltage level between said saturation voltage level and said ON voltage level, said method comprising:

charging the control input of said output switching device to a predetermined first charge level in a charging step sequence comprising a plurality of charging steps;

determining whether a next sequential charging step exists in said sequence;

if a next sequential charging step exists, charging the control input of said output switching device to a predetermined next charge level;

repeating said determining step through said repeating step until no next sequential charging step exists in said sequence;

monitoring a voltage level on at least one of said control input of said output switching device and said transmission line; and when said monitored voltage level reaches a predetermined reference voltage, connecting said control input of said output switching device to said ON voltage source.

7. A method in accordance with claim 6, wherein:

each said charging steps comprise connecting a capacitance proportional to said amount of charge associated with said charging step to said transmission line.

8. A method in accordance with claim 6, wherein:

each said charging steps comprise connecting a current source to said transmission line which charges said transmission line to said amount of charge associated with said charging step.

9. An apparatus for reducing the slew rate of a signal on a transmission line of an integrated circuit, comprising:

an output switching device characterized by an output switching resistance and a turn-on threshold voltage, said output switching device having a control input responsive to a predrive signal for placing said output switching device in one of an OFF state, a linear state, or an ON state, wherein: said output switching device is in said OFF state not driving said transmission line when said predrive signal is at a voltage level between said turn-on threshold voltage and an OFF voltage level; said output switching device is in a linear state driving said transmission line to a voltage level proportional to said predrive signal when said predrive signal is at a voltage level between said turn-on threshold voltage and a saturation voltage level; and said output switching device is in said ON state driving said transmission line to predetermined constant voltage level when said predrive signal is at a voltage level between said saturation voltage level and said ON voltage level;

a digital predrive circuit which sequences through a sequence of a plurality of charging steps, each charging step having an associated predetermined charge level, to charge said control input of said output switching device at each charge step in said sequence to said predetermined charge level associated with said charge step;

a feedback circuit which monitors a voltage level on at least one of said control input of said output switching device and said transmission line; and if said monitored voltage level reaches a predetermined reference voltage, connects said control input of said output switching device to said ON voltage source.

10. An apparatus in accordance with claim 9, wherein:

said digital predrive circuit comprises a plurality of switched capacitors switchably connectable between one or the other of said ON voltage source and said control input of said output switching device.

11. An apparatus in accordance with claim 10, wherein:

said plurality of switched capacitors have associated capacitance values that implement a thermometer weighted code.

12. An apparatus in accordance with claim 10, wherein:

said plurality of switched capacitors have associated capacitance values that implement a binary weighted code.

13. An apparatus in accordance with claim 9, wherein:

said digital predriver circuit comprises a programmable current source programmable to charge said control input of said output switching device at each charge step in said sequence to said predetermined charge level associated with said charge step.

14. An apparatus in accordance with claim 13, wherein:

said digital predrive circuit comprises a plurality of transistors switchably connectable between one or the other of said ON voltage source and said control input of said output switching device.

15. An apparatus in accordance with claim 14, wherein:

said plurality of transistors have associated resistance values that implement a thermometer weighted code.

16. An apparatus in accordance with claim 14, wherein:

said plurality of switched transistors have associated resistance values that implement a binary weighted code.

17. An apparatus for reducing the slew rate of signal transitioning from a first voltage level representing a first logic state to a second voltage level representing a second logic state on a transmission line of an integrated circuit, comprising:

a digital predrive circuit which sequences through a sequence of a plurality of charging steps during each transitioning of said signal from said first voltage level to said second voltage level, each charging step having an associated predetermined charge level, to charge said transmission line at each charge step in said sequence to said predetermined charge level associated with said charge step.

18. An apparatus in accordance with claim 17, comprising:

a feedback circuit which monitors a voltage level on said transmission line, and if said monitored voltage level reaches a predetermined high reference voltage, connects said control input of said output switching device to said a high voltage source, and if said monitored voltage level reaches a predetermined low reference voltage, connects said control input of said output switching device to said a low voltage source.

19. An apparatus in accordance with claim 17, wherein:

said digital predrive circuit comprises a plurality of switched capacitors switchably connectable between one or the other of said ON voltage source and said control input of said output switching device.

20. An apparatus in accordance with claim 17, wherein:

said digital predriver circuit comprises a programmable current source programmable to charge said control input of said output switching device at each charge step in said sequence to said predetermined charge level associated with said charge step.

* * * * *